United States Patent
Daugherty, Jr.

[11] Patent Number: 5,990,695
[45] Date of Patent: Nov. 23, 1999

[54] MEMBRANE TEST PROBE

[75] Inventor: Robert Earl Daugherty, Jr., Irvine, Calif.

[73] Assignee: Packard Hughes Interconnect Co., Irvine, Calif.

[21] Appl. No.: 09/008,661

[22] Filed: Jan. 16, 1998

[51] Int. Cl.6 .................................................. G01R 31/02
[52] U.S. Cl. ........................... 324/758; 324/754; 324/757
[58] Field of Search .................................... 324/754, 755, 324/757, 758, 765

[56] References Cited

U.S. PATENT DOCUMENTS

| | | | |
|---|---|---|---|
| 4,918,383 | 4/1990 | Huff et al. | 324/757 |
| 4,980,637 | 12/1990 | Huff et al. | 324/758 |
| 5,148,103 | 9/1992 | Pasiecznik, Jr. | 324/158 P |
| 5,264,787 | 11/1993 | Woith et al. | 324/158 P |
| 5,355,079 | 10/1994 | Evans et al. | 324/754 |
| 5,461,326 | 10/1995 | Woith et al. | 324/758 |

*Primary Examiner*—Ernest Karlsen
*Assistant Examiner*—Russell M. Kobert
*Attorney, Agent, or Firm*—Patrick M. Griffin

[57] ABSTRACT

A membrane test probe for an integrated circuit has a support frame, an annular substrate fixed to the support frame, and a flexible membrane fixed to and stretched tightly across the annular substrate. The membrane has an intermediate area that includes a plurality of probe contacts on its lower surface that are configured and arranged to be pressed against contact pads of an integrated circuit to be tested. A plurality of conductive traces are connected to the button contacts and configured and arranged for connection to test circuitry. The membrane test probe also includes a support plate for engaging an upper surface of the intermediate area and an adjustment mechanism for leveling the support plate and tensioning the membrane. The adjustment mechanism includes an adjustment ring, a lever ring and a pressure plate frame. The pressure plate frame engages the support plate and urges the same against the intermediate area of the membrane. The lever ring has a plurality of radial levers that push against the pressure plate frame at a plurality of spaced locations, and the support ring has a plurality of individually adjustable plungers deflecting respective radial levers for leveling the support plate and tensioning the membrane.

7 Claims, 3 Drawing Sheets

MEMBRANE TEST PROBE

TECHNICAL FIELD

This invention relates generally to a test probe and more particularly to a test probe for testing an integrated circuit or the like that has a flexible membrane with probe contacts for engaging the contact pads of the integrated circuit being tested.

BACKGROUND OF THE INVENTION

Integrated circuits or chips are manufactured with large numbers of identical circuits on a single wafer which ultimately are separately cut from the wafer for use. It is necessary to test each circuit individually to determine whether or not it functions as intended before separating it from the wafer.

Conventional testing employs a probe card which is provided with a large number of small tungsten blades or needles that are mechanically and electrically connected to a circuit board and act as contacts. Electrical leads extend from the contacts to the outer edge of the board for connecting the probe card to test circuitry. In use, the blades or needles are moved into engagement with the pads of an integrated circuit. This provides an electrical connection so that signals can be read to determine the integrity of the circuit on the chip.

The needles or blades must all fall in the same plane in order to assure that each one makes electrical contact with a contact pad of the integrated circuit. This is accomplished by bending the blades or needles after they are mounted on the probe card, which is laborious, time consuming and expensive. Even after such adjustment the blades or needles tend to creep back toward their original positions so that their adjusted locations are lost. This loss of adjustment also comes about from the pressure of the needles against the chips, aggravated by the scrubbing action used to assure penetration of any oxide coating. As a result, constant maintenance is necessary or the probe cards will not perform their intended function. Even when in proper adjustment, the needles cannot compensate for significant differences in the heights of the contact pads on the integrated circuit chips being tested. The needles also may apply excessive forces against the chips so as to damage the chips. The close spacing necessary for testing some chips cannot be achieved with conventional needle contacts.

U.S. Pat. No. 5,148,103 granted to John Pasiencznik Sep. 15, 1992, discloses an improved testing arrangement using a test probe that includes a flexible visually clear and self planarizing membrane. Air pressure behind the membrane is regulated to press probe contacts of the membrane into engagement with the contact pads of the integrated circuit being tested.

U.S. Pat. No. 5,264,787 granted to Blake F. Woith et al. Nov. 23, 1993, discloses another improved testing arrangement using an improved test probe that assures good electrical connections with the contact pads of the integrated circuit chip while avoiding considerable contact of the membrane with other portions of the chip. This improved test probe utilizes a support form behind the membrane to press the probe contacts of the membrane into engagement with contact pads of the integrated circuit being tested. Three embodiments are disclosed including an embodiment using a rigid glass plate as shown in FIG. 9 of the patent.

U.S. Pat. No. 5,461,326 granted to Blake F. Woith et al. Oct. 24, 1995, discloses a further improved test probe that also utilizes a support form behind the membrane. This support is self-leveling and self tensioning.

As noted in the patent, it is important in the use of the membrane test probe that the membrane itself be properly tensioned and configured, because the membrane, which is effectively stretched across the inner area of an annular support, tends to sag or stretch in a haphazard manner. Moreover, because test probe contacts or contact pads on a device to be tested are not all of the same height, good electrical contact may not be accomplished between all test probe contacts and all contact pads of the device under test. Further, because of the curvature of the membrane, the plane of the group of probe test contacts carried by the membrane may not be precisely parallel to the plane of the contact pads of the device under test. Moreover, the test apparatus and the device under test are not necessarily precisely parallel with one another so that the plane of the probe test contacts may be at times slightly inclined to the plane of the contact pads of the device under test.

Accordingly, it is an object of the present invention to provide a membrane test probe that avoids or minimizes above-mentioned problems.

SUMMARY OF THE INVENTION

In carrying out principles of the present invention in accordance with a preferred embodiment thereof, a membrane test probe including a flexible membrane that mounts a group of probe test contacts is tensioned and leveled to provide proper configuration of the membrane area at the probe test contacts. This is accomplished by mounting a small pressure plate on the inner surface of the membrane in the area of the probe test contacts and pressing against the margin of the pressure plate by an adjustment device that includes several individually adjustable plungers that locate the probe test contacts in a plane parallel to the integrated circuit being tested and apply firm downward force to ensure a good electrical contact. The adjustable plungers are part of an adjustment mechanism that preserves visual inspection of the integrated circuit during the testing procedure.

DESCRIPTION OF THE PREFERRED EMBODIMENT

Figure 1:
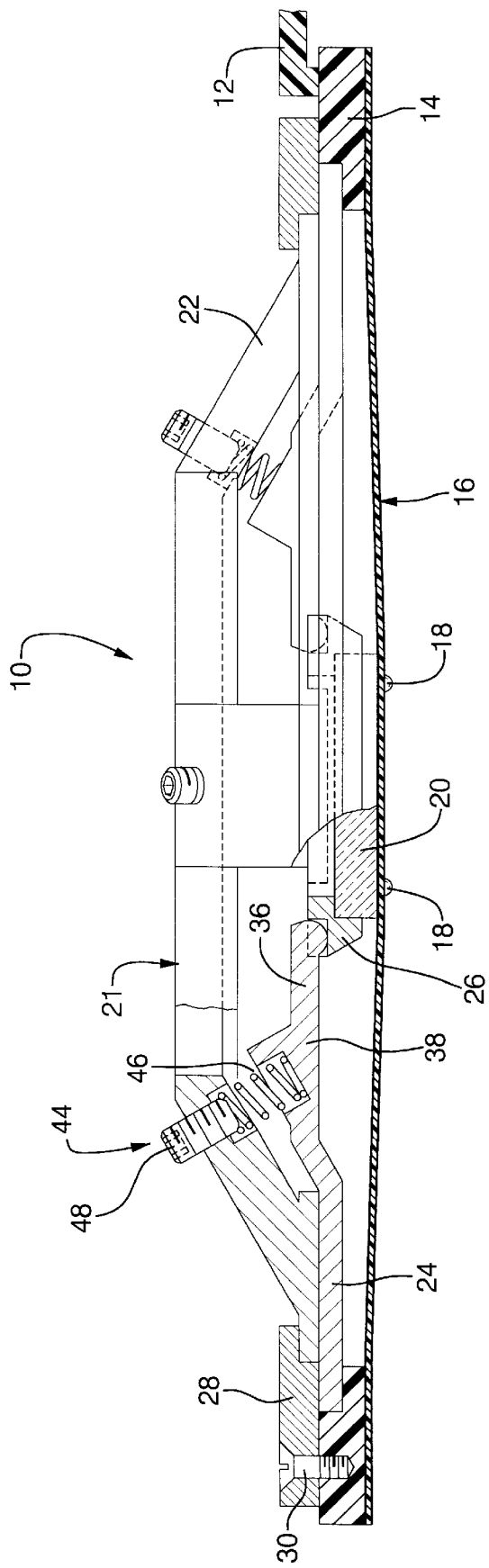
FIG. 1 is a sectional view of a membrane test probe for testing integrated circuits or the like, in accordance with the invention.

Referring now to FIG. 1 of the drawings, the membrane test probe 10 is mounted on a support frame 12 of the test machine which conventionally includes a probe card as illustrated in U.S. Pat. No. 5,264,787 granted to Blake F. Woith et al. Nov. 23, 1993, This patent is discussed above and is hereby incorporated herein by reference.

Figure 2:
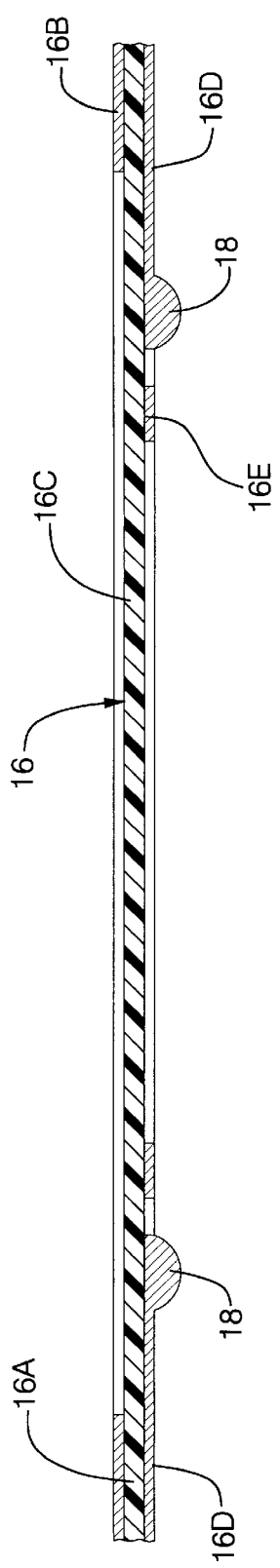
FIG. 2 is an enlarged fragmentary sectional view of the membrane component of the test probe of FIG. 1.

Test probe 10 further includes an annular substrate 14 that is fixed to the support frame 12 and a flexible membrane 16 that is fixed to and stretched tightly across the annular substrate 14. Membrane 16 is of laminated construction including a layer 16a of transparent polyimide on the upper side of which is a layer 16b of copper that acts as a grounding plane as shown in FIG. 2. A central opening in the copper layer exposes an intermediate or central portion 16c of transparent polyimide layer 16a. On the lower side of the exposed intermediate portion 16c are protuberant gold plated contacts 18 of hemispherical, conical, pyramidal or other shape.

Figure 3:
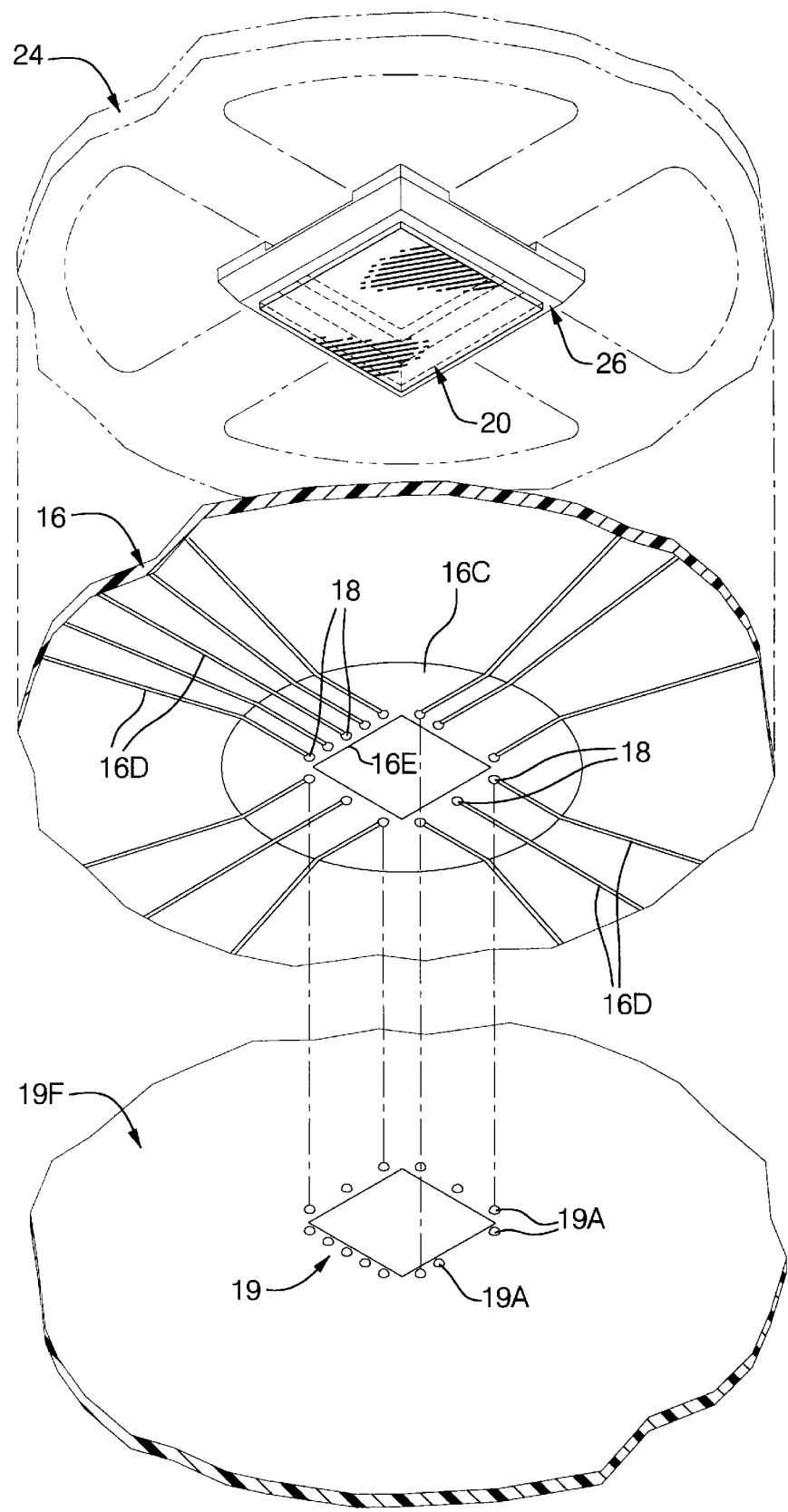
FIG. 3 is an exploded perspective view of the test probe of FIG. 1 in relation to an integrated circuit chip being tested.

These test probe contacts 18 are arranged in the exact pattern of contact pads on an integrated circuit chip 19 to be tested and configured to be pressed against the contact pads 19a of the integrated circuit to be tested as best shown in FIG. 3. Integrated circuit chip 19 is one of many on wafer 19b. However only the circuit chip 19 being tested is shown in the interest of clarity. A plurality of conductive traces 16d on membrane 16 are connected to respective test probe contacts 18. Traces 16d are configured and arranged for connection to test circuitry via the probe card that is part of support 12 in a well-known manner. A grounding bus 16e is also included within contacts 18.

Test probe 10 further includes a rigid pressure plate 20 of glass or other transparent material that engages the upper surface of the intermediate portion 16c of membrane 16 for pressing contacts 18 into engagement with contact pads 19a; and an adjustment mechanism 21 for locating pressure plate 20 in a deserved plane and tensioning membrane 16 via pressure plate 20.

The adjustment mechanism 21 includes an adjustment ring 22, a lever ring 24 and a pressure plate frame 26. Adjustment ring 22 and lever ring 24 are precisely mounted in a concentric relationship with the intermediate area 16c of membrane 16 in any suitable manner. In this particular instance, adjustment ring 22 and lever ring 24 are attached to the upper surface of annular substrate 14 by a clamp ring 28 that is secured to annular substrate 14 by a plurality of machine screws 30, one of which is shown.

Figure 4:
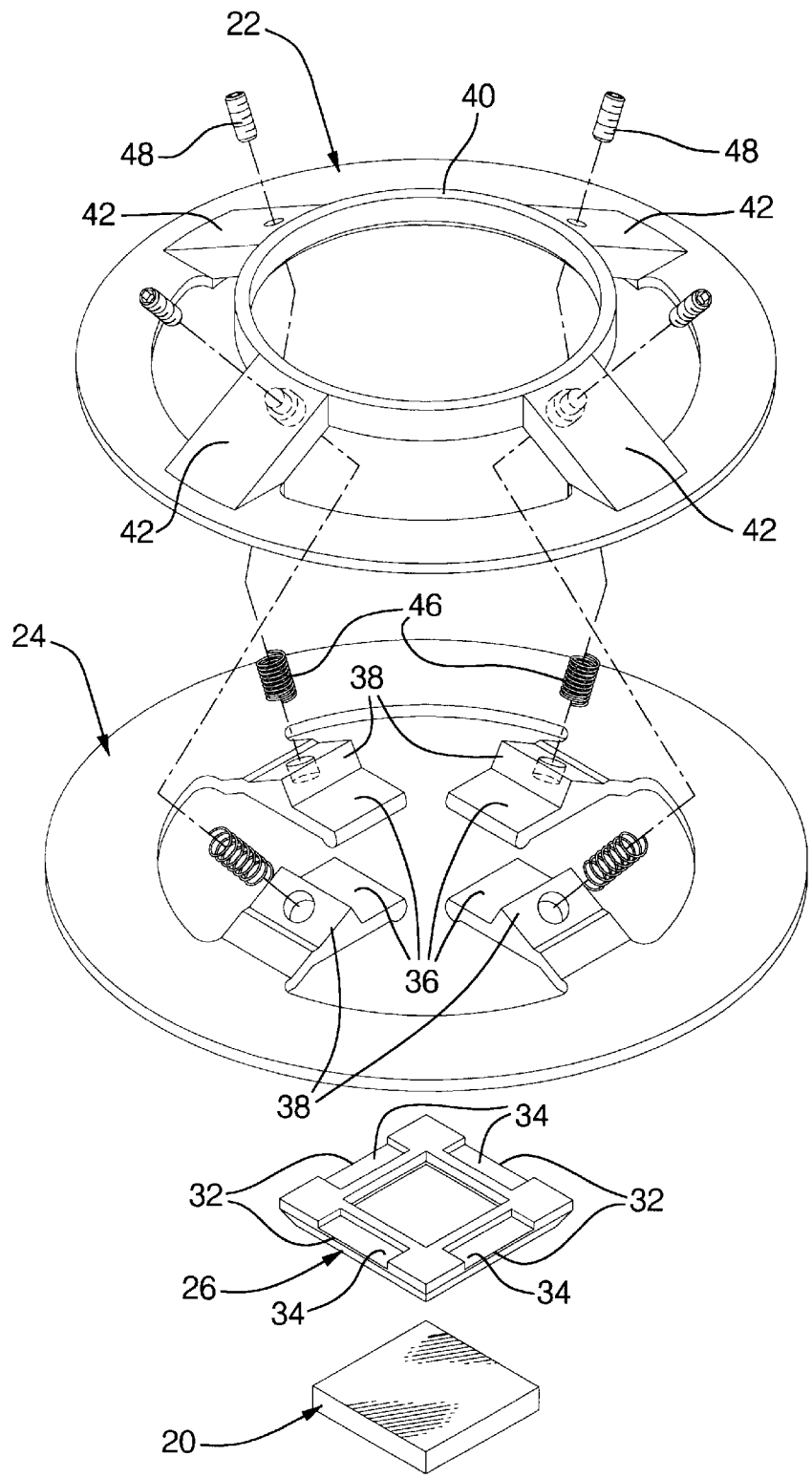
FIG. 4 is an exploded perspective view of an adjustment mechanism for the test probe shown in FIG. 1.

Pressure plate frame 26 engages the periphery and top margin of rigid glass pressure plate 20 in order to push the rigid glass pressure plate 20 against the intermediate area 16c of membrane 16. In this particular instance, support plate 20 is square so that frame 26 has four rectangular sides 32 of equal length and each side has a central cavity 34 at the upper outer edge as best shown in FIG. 4.

Lever ring 24 has an annular base (which as indicated above is clamped to annular substrate 14) and a plurality of radial levers 36 that extend radially inwardly in cantilever fashion. In this instance, lever ring 24 has four radial levers 36 of equal length that are equally spaced around the circumference of the annular base of lever ring 24. The four radial levers 36 engage the four rectangular sides 32 of frame 26 respectively for leveling pressure plate frame 26. Each radial lever 36 has a rounded end that engages in cavity 34 of its associated side 32 of pressure plate frame 26 and an intermediate plunger pad 38 for receiving a plunger force for depressing radial lever 36 and moving the end of the radial lever downwardly.

Adjustment ring 22 has an annular base (which as indicated above is clamped to annular substrate 14) and a smaller annular sight ring 40 that is spaced above the annular base and connected to the annular base by a plurality of angular struts 42. Sight ring 40 has an inner diameter that is larger than frame 26 so that the view through transparent pressure plate 20 and transparent intermediate portion 16c of membrane 16 is not obstructed by adjustment ring 22 or the adjustable plungers 44 described below. Hence, visual inspection of the alignment of probe contacts 18 with pad contacts 19a is not hindered by adjustment mechanism 21 in any way.

An angular strut 42 is above each radial lever 36 so that in this particular instance there are four angular struts 42 equally spaced around the circumference of the adjustment ring 22. Each strut 42 carries an adjustable plunger 44 for applying a force to the plunger pad 38 of the radial lever 36 below it.

Adjustable plunger 44 is a resilient type plunger comprising a coil spring 46 and a set screw 48. Each strut 42 has a threaded hole 50 receiving a set screw 48 at the upper end that is aligned with the plunger pad 38 of its associated radial lever 36. Each coil spring 46 has one end in a blind hole in plunger pad 38 and an opposite end in threaded hole 50 and abutting the lower end of the set screws 48. Set screws 48 are turned or screwed individually in threaded holes 50 to locate glass pressure plate 20 in a desired plane (usually parallel to test circuit 19 and level) and to tension membrane 16 in a precise manner.

While a rectangular frame and four radial levers 36 have been illustrated, the glass pressure plate 20 and frame 26 can take other shapes for instance circular. Moreover the number of radial levers 36 can be varied so long as there is a minimum of three radial levers and three plungers to operate the radial levers 36 individually.

Obviously, many modifications and variations of the present invention in light of the above teachings may be made. It is, therefore, to be understood that, within the scope of the appended claims, the invention may be practiced otherwise than as specifically described.

I claim:

1. A membrane test probe for testing an integrated circuit chip or the like comprising:

a support frame, an annular substrate fixed to the support frame, a flexible membrane fixed to and stretched tightly across the annular substrate, the flexible membrane having upper and lower surfaces, a plurality of test probe contacts on an intermediate portion of the lower surface, the test probe contacts being configured and arranged to be pressed against contact pads of an integrated circuit chip or the like to be tested, a plurality of conductive traces on the membrane connected to respective ones of the test probe contacts and configured and arranged for connection to test circuitry, a pressure plate for engaging the upper surface of the intermediate portion of the membrane, and an adjustment mechanism for leveling the pressure plate and tensioning the membrane, the adjustment mechanism including an adjustment ring, a lever ring and a pressure plate frame, the pressure plate frame engaging the pressure plate and urging the same against the upper surface of the intermediate portion of the membrane, lever ring having a plurality of radial levers engaging the pressure plate frame at a plurality of spaced locations, and the adjustment ring having a plurality of adjustable plungers for individually deflecting respective ones of the radial levers to locate the pressure plate in a desired plane and to tension the membrane in a precise manner.

2. The integrated circuit test probe as defined in claim 1 wherein each of the adjustable plungers comprises a coil spring and a set screw that screws into the adjustment ring.

3. The integrated circuit test probe as defined in claim 1 wherein the intermediate portion of the flexible membrane is transparent and the pressure plate is rigid and transparent.

4. The integrated circuit test probe as defined in claim 3 wherein the adjustment ring comprises an annular base and a smaller annular sight ring that is spaced above and connected to the annular base by plurality of angular struts that carry the plurality of adjustable plungers.

5. The integrated circuit test probe as defined in claim 4 wherein the annular sight ring has an inner diameter that is larger than the pressure plate frame.

6. The integrated circuit test probe as defined in claim 5 wherein each of the plungers comprises a coil spring and a set screw that screws into one of the angular struts.

7. The integrated circuit test probe as defined in claim 6 wherein the plurality of radial levers each have a pressure pad intermediate its ends comprising a blind ended hole that receives an end of the coil spring of one of the plungers.

\* \* \* \* \*